(12) United States Patent
Margalit et al.

(10) Patent No.: US 6,885,689 B2
(45) Date of Patent: Apr. 26, 2005

(54) MULTISEGMENT INTEGRATED LASER AND A METHOD FOR FABRICATION THEREOF

(75) Inventors: Moti Margalit, Zichron Yaaqov (IL); Meir Orenstein, Haifa (IL)

(73) Assignee: Lambda Crossing Ltd., Caesaria (IL)

( * ) Notice: Subject to any disclaimer, the term of this patent is extended or adjusted under 35 U.S.C. 154(b) by 254 days.

(21) Appl. No.: 09/946,138

(22) Filed: Sep. 5, 2001

(65) Prior Publication Data

US 2002/0037023 A1 Mar. 28, 2002

Related U.S. Application Data

(60) Provisional application No. 60/230,457, filed on Sep. 6, 2000.

(51) Int. Cl.[7] ............................................... H01S 5/00
(52) U.S. Cl. ........................................ 372/50; 372/46
(58) Field of Search ............................. 372/43–50, 92, 372/93, 94, 108, 97, 99; 359/345

(56) References Cited

U.S. PATENT DOCUMENTS

| | | |
|---|---|---|
| 4,622,671 A | 11/1986 | Tsang |
| 5,126,876 A | 6/1992 | O'Meara |
| 5,398,256 A | 3/1995 | Hohimer et al. |
| 5,403,775 A | 4/1995 | Holonyak, Jr. et al. |
| 5,548,607 A | 8/1996 | Tsang |
| 5,742,633 A | 4/1998 | Stone et al. |

FOREIGN PATENT DOCUMENTS

| | | | |
|---|---|---|---|
| JP | 03-054529 A | * 3/1991 | ............ H01S/3/06 |
| WO | WO01/27692 A1 | 4/2001 | |
| WO | WO01/27692 | 4/2001 | |

OTHER PUBLICATIONS

Y. Suematsu et al., "Dynamic Single–Mode Semiconductor Lasers with a Distributed Reflector", *IEEE J. of Lightwave Technology*, 1983, pp. 161–176, vol. LT–1, No. 1 Mar. 1983.

Chen et al, "Monolithic 1.54 mum semiconductor ring lasers grown by selective area epitaxy" Proceedings of the Conference on Lasers and Electro Optics, Baltimore, May 2–7, 1993, New York, IEEE, US, vol. Conf. 13, May 2, 1993, pp. 264–265.

Patent Abstracts of Japan, "JP 62287683, published Dec. 14, 1987, applicant NEC Corp, entitled Light Branching Semi-conductor Laser."

Little et al, "Microring Resonator Channel Dropping Filters", Journal of Lightwave Technology, vol. 15, No. 6, pp. 998–1005, Jun. 1, 1997.

* cited by examiner

*Primary Examiner*—Quyen Leung
(74) *Attorney, Agent, or Firm*—Browdy and Neimark, P.L.L.C.

(57) ABSTRACT

A multisegment laser diode structure is presented in the form of two spaced-apart linear waveguide segments and two spaced-apart ring-like waveguide segments, arranged such that each of the ring-like segments is optically coupled to each of the linear waveguide segments. At least one of the waveguide segments includes an active lasing material. The waveguide segments are thus arranged such that four separate electrical contacts can be provided to four waveguide segments, respectively, thereby enabling separate driving of each of the waveguide segments.

21 Claims, 4 Drawing Sheets

MULTISEGMENT INTEGRATED LASER AND A METHOD FOR FABRICATION THEREOF

FIELD OF THE INVENTION

This invention is generally in the field of integrated lasers based on diode lasers, and relates to a multisegment integrated laser and a method for its manufacture. The invention is particularly useful for optical communications and related applications, such as tunability, modulation, amplification, wavelength conversion, and others.

BACKGROUND OF THE INVENTION

Laser diodes have a vast field of applications and they are propelling the optical communications field. This is due to their small size, relatively simple construction and high reliability. In order to support higher functionality of such light sources, many configurations, in which an "on-chip" laser is composed of or attached to multiple functional segments, have been introduced in recent years. The following are some examples of the known light sources of the kind specified:

(1) $C^3$ laser, where laser cavities are monolithically cascaded (U.S. Pat. No. 4,622,671);

(2) DBR laser, where the active segment(s) is(are) sandwiched between two gratings segments (Y. Suematsu, S. Arai and K. Kishino, "*Dynamic Single Mode Semiconductor Laser with a Distributed Reflector*", IEEE J of Lightwave Tech. LT-1, 161 (1983));

(3) Master oscillator power amplifier (MOPA), where the laser segment is attached to a power amplifier segment (U.S. Pat. No. 5,126,876); and (4) a monolithically integrated externally modulated laser, where the laser segment is attached to an external modulator segment (U.S. Pat. No. 5,548,607)

All the above prior art configurations suffer from crucial difficulties in their manufacture and in the possibility of extending their functionality. One of the key problems is to generate an on-chip laser mirror, in which the functionally different segments of the laser are separated from each other. Various technologies have been suggested to implement this idea, such as on-chip etching or cleaving, or using sub-micrometer period gratings. However, due to the technological difficulties, all existing devices of the kind specified, such as tunable integrated sources, MOPA, monolithically mode locked lasers and monolithically externally modulated lasers, are difficult to fabricate and thus expensive.

SUMMARY OF THE INVENTION

There is accordingly a need in the art to facilitate the manufacture and operation of integrated lasers by providing a novel multisegment laser diode and method for its manufacture, to enhance the functionality of the laser by providing separation between the functionally different segments of the laser.

The present invention utilizes the advantage of the concept of a complex cavity (resonator) based on two segments of waveguides inter-coupled by at )east two integrated ring microcavities. This technique has been developed by the inventors of the present application and is disclosed in WO 01/27692, assigned to the assignee of the present application. The main idea of the present invention is based on utilizing such a configuration of a complex cavity as the core technology for producing multisegment functional lasers. According to his concept, the laser mirrors are ring microcavities which can be of very high quality, thus enabling the implementation of mirrors with a desired reluctance, while as cleaved or as etched mirrors of the prior art techniques are limited to approximately 30% reflectance, This facilitates the generation of ultrashort cavity lasers. The ring mirror is wavelength sensitive, and can thus be used for both stabilizing the laser frequency and tuning it by externally changing the ring parameters.

The unique feature of the above configuration consists of that light reflected from a ring mirror enters a channel (waveguide) different from that of die incident light propagation. Hence, an additional segment is generated in the laser cavity that can be exploited for an additional functionality (e.g., active mode locking, internal EA modulation, etc.). The ring mirror based technology does not require sub-micron resolution (i.e., about 0.2 micron for the DBR gratings). The ring mirror is relatively small (e.g., at the order of 5–50 $\mu$m in diameter). The ring mirror is at least a four-port coupler, which can be further used to enhance tie functionality and inter-chip connectivity of the multisegment lasers. All the segments (linear and ring waveguides) are buried and electrodes are deposited such that each of the segments can be manipulated separately (by the injection of a current or by applying external fields).

Since optical waveguides can be implemented in a complex manner, the universal quantity characterizing the behavior of the confined light is the effective refractive index of the waveguide. In conventional passive devices, the difference between the effective refractive index of the waveguide and the index of the surrounding medium is typically smaller than 1%. In a semiconductor diode laser, the effective index difference is about 10%. When using ring micro resonator structures (with a small radius), the effective refractive index of the ring waveguide has to be relatively large, i.e., typically in the range of 10%–20% (depending on the ring diameter), to accommodate tight mode confinement and small losses.

It should be understood that the terms "ring" or "ring-like" used herein signify any sufficiently smooth stricture of a closed-loop or ring-like shape, such as elliptical, stadium-like. etc., and not necessarily a circular shape. Thus, according to one aspect of the present invention, there is provided a multisegment laser diode structure comprising two spaced-apart linear waveguide segments and two spaced-apart ring-like waveguide segments carried on a substrate, each of the ring-like waveguide segments being coupled to each of the linear waveguide segments, wherein at least one of the waveguide segments includes an active lasing material, the segments' arrangement enabling separate electrical contact to each of the segments, thereby enabling separate operation of each of the segments by current injection or application of an external field.

According to one embodiment of the invention, each of the waveguide segments is made of an active lasing material. In this case, the segments are produced either by the dry etching of a semiconductor layer structure, as typically employed in the conventional ridge-based laser manufacture, or by a planar process based on proton implantation within tie areas surrounding the segments to generate a gain-guiding laser.

The specific layer structure, as well as the physical separation between the ring-like and linear waveguide segments, is designed so as to provide the required optical coupling between the segments. Each of the segments call be used for modulation, tuning, q-switching and mode locking.

According to another embodiment of the invention, only the linear waveguide segments contain the laser active material, and are defined by conventional dry etching. Subsequently, a deep etch trench (below the active layer) is etched in between the two linear ridge segments. Then the inter-laser spacing is covered by a thin low index layer, and subsequently by a high index layer, in which the ring microcavities are defined and subsequently buried. The ring segments can be used to tune the laser (e.g., by the thermooptic effect).

The above cavities may be coupled to external segments either horizontally or vertically (for miniaturization) through one or the two rings (e.g., to a power amplifier or external modulator, or to a passive waveguide).

According to another broad aspect of the invention, there is provided a method for manufacturing a multisegment laser diode structure the method comprising:

(a) growing a semiconductor structure with a p-n junction between two semiconductor layers and an active laser layer within the junction;

(b) patterning said semiconductor structure and carrying out layer deposition processes, to define two spaced-apart linear metalized ridge segments and two spaced-apart ring-like metalized ridge segments, the segments' arrangement providing desired optical coupling of each of the ring-like segments to each of the linear segments, each of the ridge segments being formed with a metal layer on top thereof;

(c) depositing a burying layer onto a structure obtained in step (b), allowing for contact windows above each of the segments; and (d) carrying out a further metal deposition to form four electrical contacts with the metal layer on top of the four segments, respectively.

The patterning of the semiconductor structure may comprise patterning of the top layer thereof to define both the linear waveguide segments and the ring waveguide segment, all the segments thereby containing an active lasing material. Alternatively, Me patterning of the semiconductor structure may include patterning of the top layer thereof to define the spaced-part linear waveguide segments, and patterning (etching) of the top and active laser layer underneath the top layer, or all three layers of the semiconductor structure within the space between the linear waveguides, thereby defining an interlaser spacing. In this case, the two ring waveguide segments are defined in a high refraction index layer deposited within the interlaser spacing on top of a low refraction index layer (buffer layer).

According to yet another aspect of the present invention, there is provided an integrated optical device comprising a multisegment laser diode structure constructed as described above, and an additional waveguide segment optically coupled to at least one of said linear or ring-like waveguides.

BRIEF DESCRIPTION OF THE DRAWINGS

In order to understand the invention and to see how it may be carried out in practice, a preferred embodiment will now be described, by way of non-limiting example only, with reference to the accompanying drawings, in which:

FIGS. 1 to 3 illustrate the main stages in the manufacture of a laser structure according to one embodiment of the invention, wherein FIG. 1 illustrates a structure after the dry etch step; FIG. 2 illustrates the structure of FIG. 1 after tie deposition of a burying layer and opening contact windows; and FIG. 3 illustrates the structure of FIG. 2 after deposition of the electrode;

DETAILED DESCRIPTION OF THE INVENTION

Figure 1:
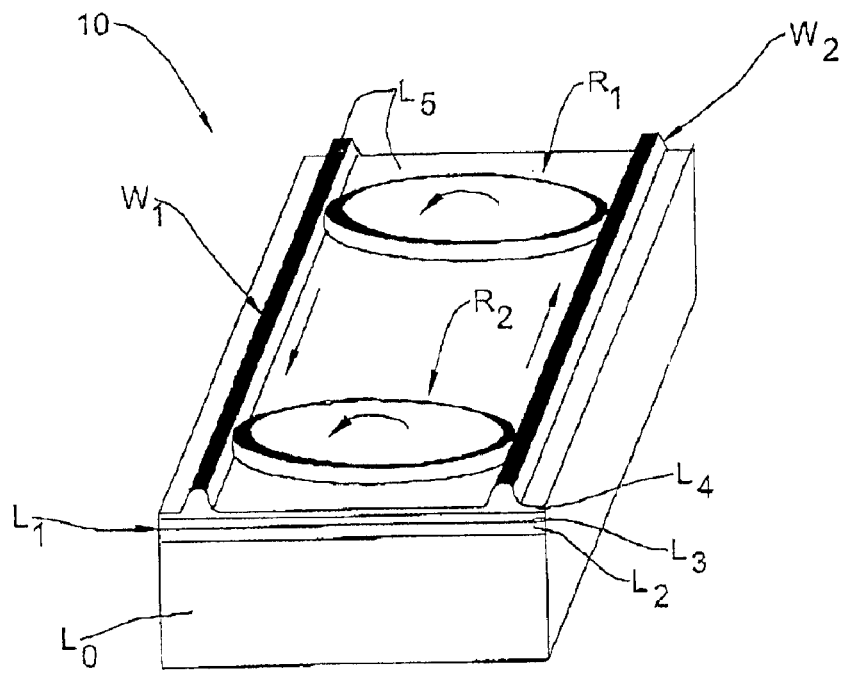
Figure 2:
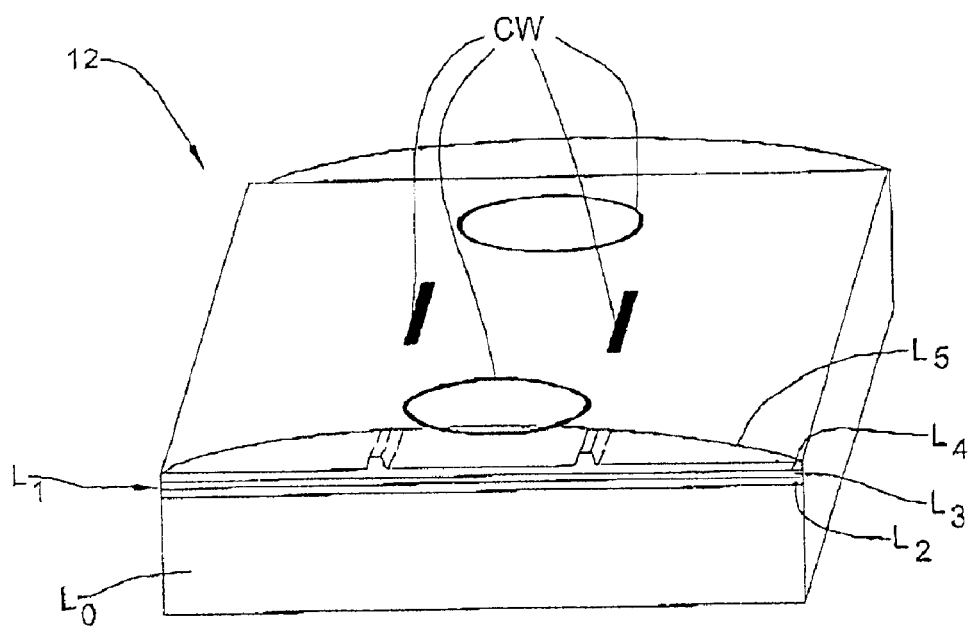
Figure 3:
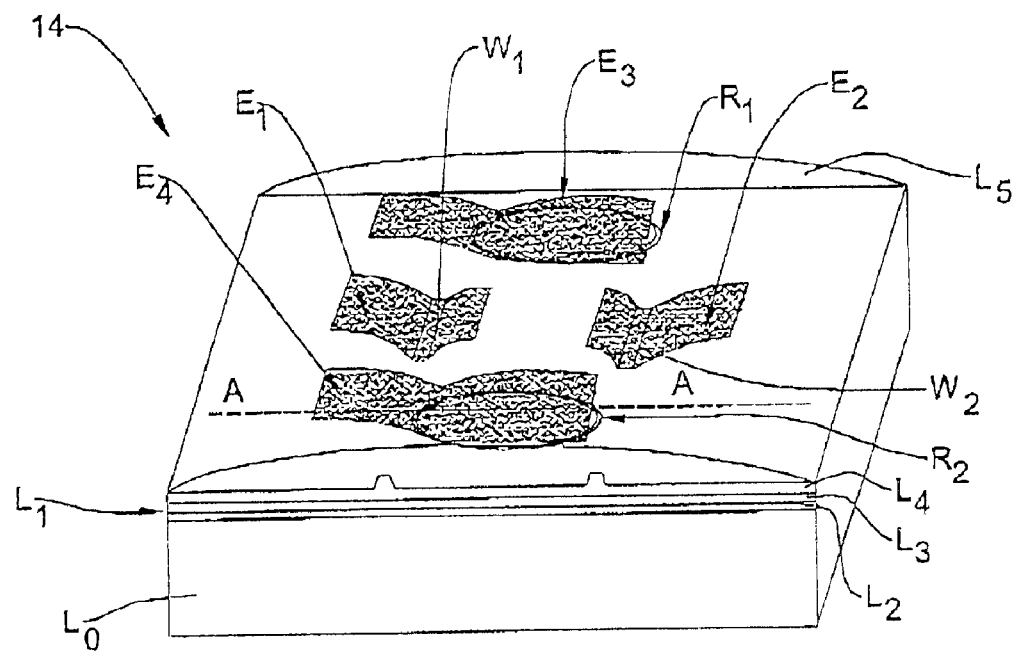

Referring to FIGS. 1–3, there are illustrated main operational steps in the manufacture of a multisegment laser diode structure according to one example of the inventions namely, a laser of the index-guide type typically comprising an active region interposed between n- and p-type semiconductor layers grown on a substrate.

FIG. 1 shows a structure 10 obtained by such main processes of integrated technology as deposition, metalization and ridge etching. Thus, the structure 10 is composed of a substrate layer $L_0$ (i.e., made of GaAs or InP) carrying a laser layer-structure $L_1$, which is formed by sequentially depositing an n-type semiconductor layer $L_2$, an active laser layer $L_3$, and a p-type semiconductor layer $L_4$ to define a p-n junction region between the semiconductor layers. When using the GaAs substrate $L_0$, the n-type layer $L_2$ is AlGaAs doped with Si, layer $L_3$ is undoped AlGaAs containing several quantum wells of GaAs or InGaAs, and the p-type layer $L_4$ is another AlGaAs doped with Be or C. When using die InP substrate $L_0$, the n-type layer $L_2$ is InP/InGaAsP doped with n-dopant, layer $L_3$ is the laser active layer made of several quantum wells of InGaAsP, and layer $L_4$ is another InP/InGasP layer with p-dopping (e.g. C).

Layer $L_4$ is appropriately patterned, so as to form two parallel spaced-apart linear ridge segments $W_1$ and $W_2$, and two spaced-apart ring-like ridge segments $R_1$ and $R_2$. A metal layer $L_5$ (the so-called p-metal) (e.g., Ti/Pt/Au) is then deposited on the surface of the patterned p-type semiconductor layer $L_4$, and etched to provide metal coating on top of each of the ridge segments. The metal layer can be deposited and etched prior to etching the layer $L_4$ and may serve also as etch masks for the etching of layer $L_4$.

The linear ridge segments $W_1$ and $W_2$ serve as waveguides, and the ring ridge segments $R_1$ and $R_2$ serve as resonator loop cavities between the two waveguides, all the waveguides containing an active lasing material. The resonator cavities (rings) serve as frequency-selective mirrors, the resonator cavities and the waveguide sections creating together a closed loop compound resonator. The physical characteristics of the compound resonator can be controlled to adjust its optical storage characteristics (refractive indices). Generally speaking, the change in the refractive index will induce the required phase shift to change the frequency response of the compound resonator. Such an active phase affecting may be achieved by applying any suitable thermo-optic, electro-optic, piezo-electric or the like effects mainly within the ring resonator regions but also on the linear waveguide region between the rings.

FIG. 2 illustrates a structure 12 obtained by applying further deposition and etching processes to the structure 10. As shown, a passivation or burying layer $L_6$ (e.g., polyimid) is deposited on top of the structure 10, and is then selectively etched to open contact windows CW, which thus become exposed to further processing.

FIG. 3 illustrates the entire laser structure 14 obtained by applying a metal deposition process to the structure 12 to fabricate electrodes $E_1$–$E_4$ above the ridge segments. Thus, electrodes $E_1$ and $E_2$, and electrodes $E_3$ and $E_4$ present contact pads for the two linear segments (waveguides) $W_1$ and $W_2$ and two ring segments $R_1$ and $R_2$, respectively.

Figure 4:
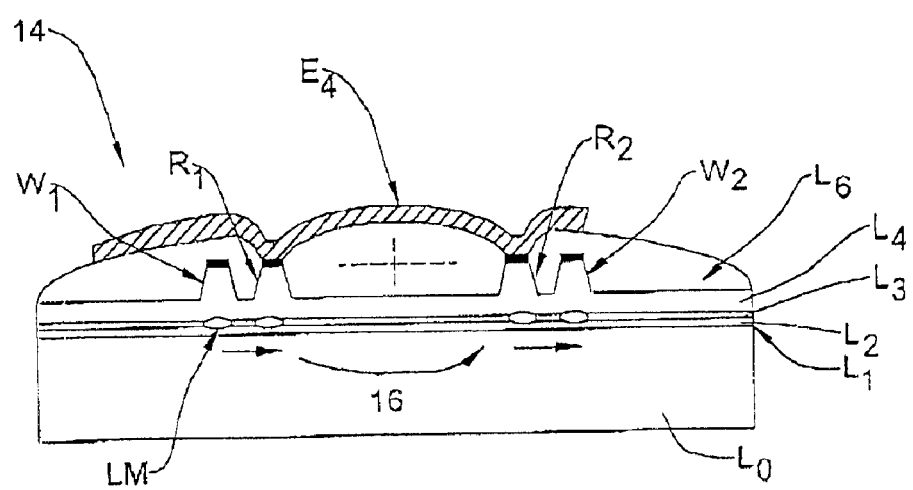
FIG. 4 illustrates a cross-section of the structure of FIG. 3 taken along line A—A.

Turning now to FIG. 4, there is illustrated a cross-sectional view of the structure 14 along line A—A (FIG. 3) showing a light-coupling scheme (arrows 16) in the structure 14. Light is coupled from the waveguide $W_1$ to waveguide $W_2$ through the resonator rings $R_1$ and $R_2$ in accordance with the resonance condition thereof (selective frequency range). As shown, the electrodes are arranged such that each of the segments can be manipulated (driven) separately by the injection of a current or by applying external fields.

Figure 5A:
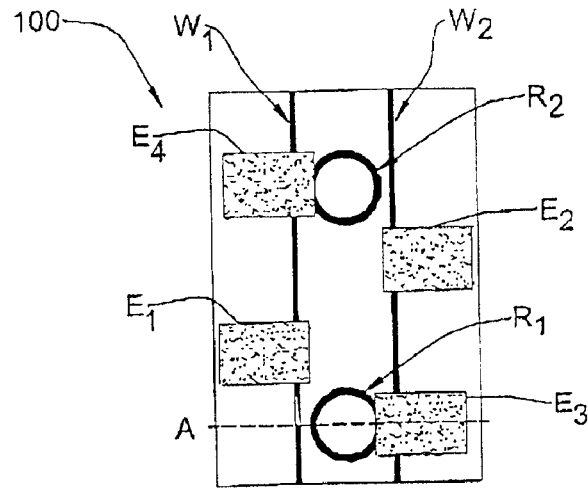
FIGS. 5A and 5B illustrate top and cross sectional views, respectively, of a laser structure according to another embodiment of the invention.
Figure 5B:
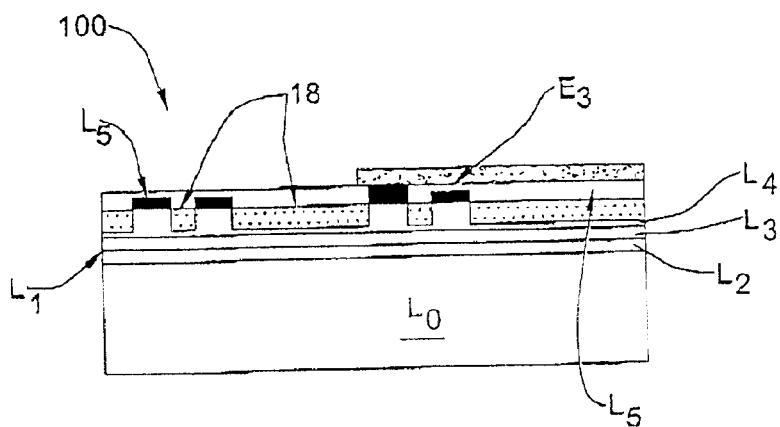

In the above example, the segments are produced by dry etching of the semiconductor layer structure, and the laser structure of the index-guide type. Reference is now made to FIGS. 5A and 5B, illustrating a laser structure 100 according to another example of the invention, namely, a laser of die gain-guide type.

FIG. 5A illustrates a top view of the structure 100, and FIG. 5B illustrates a cross section thereof taken along line B—B. The structure 100 is constructed generally similar to the previously described example, namely, utilizes the principles of integrated technology for growing the laser layer-structure $L_1$ (n-type layer $L_2$, active laser layer $L_3$ and p-type layer $L_4$) on the substrate layer $L_0$. The same materials and relative disposition of layers as described above with respect to the device 10 can be used in the device 100. Here, however, the waveguide segments $W_1$, $W_2$, $R_1$ and $R_2$ are produced by a planar process based on proton implantation within the areas surrounding the segments.

Thus, proton-implanted areas 18 are formed in the p-semiconductor layer $L_4$ within spaces between the ridge segments, thereby generating insulation between the ridge segments. A further insulating layer $L_7$ ($SiO_2$ or $Si_3N_4$ or polyImid is then deposited and patterned, or deposited through a mask, in a manner to enable the appropriate fabrication of contact pads (electrodes) $E_1$–$E_4$, such that each of the segments can be manipulated separately (by injection of a current or by applying electrical, thermal or mechanical fields).

Figure 6:
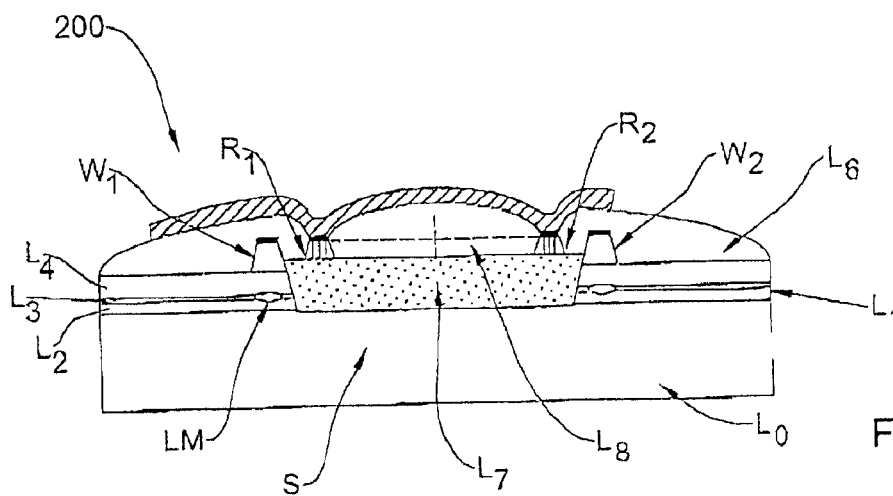
FIG. 6 illustrates a laser structure according to yet another embodiment of the invention.

FIG. 6 illustrates a laser diode structure 200, differing from the above-described examples in that only two linear waveguide segments contain the laser active material. The structure 200 comprising the laser layer-structure $L_1$ is grown on a substrate layer $L_0$ in the above-described manner. Linear waveguides $W_1$ and $W_2$ are defined by conventional dry etching, and a deep etch trend (underneath at least layer $L_3$—the active layer) is then etched between the two linear ridge segments defining an interlaser spacing S. The interlaser spacing S is subsequently coated by a thin buffer layer $L_8$ made of low refraction index material (e.g., $SiO_2$), and a layer $L_9$ of a higher index material (e.g., $Si_3N_4$, Si). Ring segments $R_1$ and $R_2$ are defined in the high index material layer $L_9$. The linear and ring segments are buried by depositing a passivation layer $L_6$. The ring segments $R_1$ and $R_2$ can be used to tune the laser, for example, by a thermooptic effect.

Figure 7A:
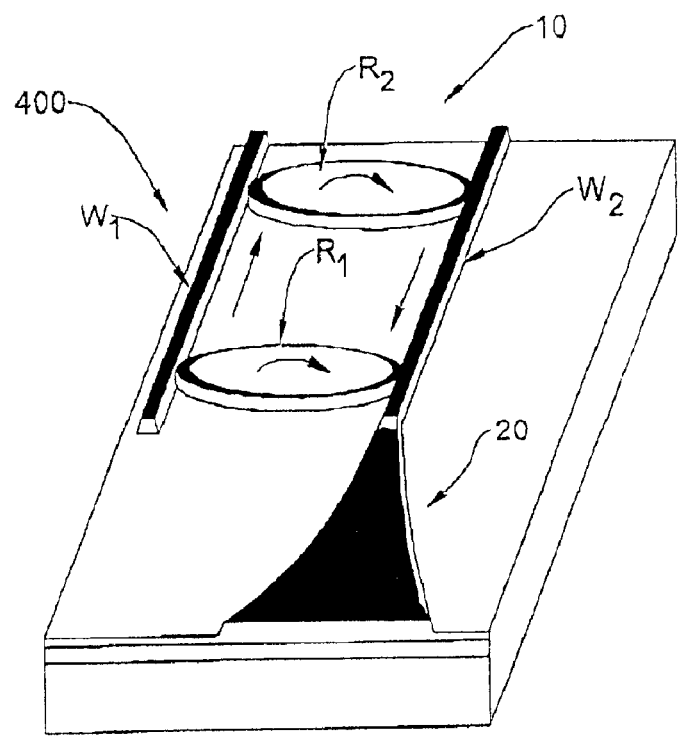
FIGS. 7A and 7B illustrate two more examples, respectively, of a structure according to the invention.
Figure 7B:
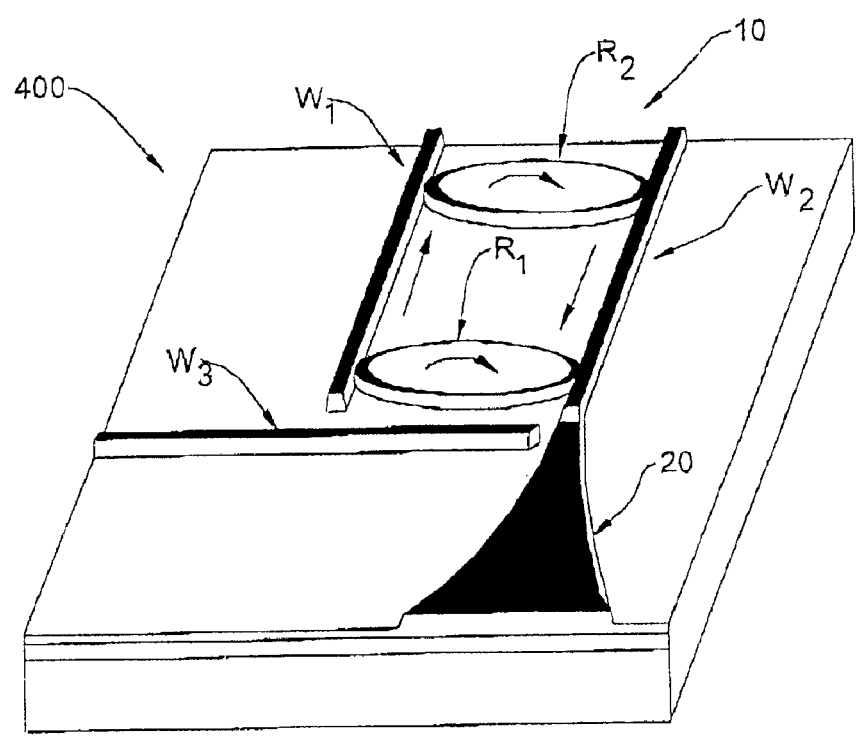

FIGS. 7A and 7B present structures according to two more examples of the invention, respectively, illustrating how the laser structure according to the invention can, be coupled to other functional devices. In the example of FIG. 7A, a structure 300 utilizes a flared amplifier 20 as a functional device coupled to the laser structure. The operation of the flare amplifier is known per se and therefore need not be specifically described, except to note the following. In the structure 300, due to the provision of ring resonators $R_1$ and $R_2$ acting as mirrors, the need for a DBR type or cleaved mirror between the laser and the flared amplifier (which is typically provided in the conventional devices of the kind specified and which is very difficult to manufacture) is eliminated. In a structure 400 of FIG. 7B, such functional devices to which the laser structure according to the invention can be easily coupled are the flared amplifier 20 and an additional waveguide $W_3$, which may serve as a part (active element) of another integrated optical device or be a passive waveguide directing light to another device(s).

In the above examples of FIGS. 7A and 7B, the linear waveguide segments are coupled to external segments (functional devices) horizontally. It should, however, be understood that vertical connection between these segments through. one or two rings could be provided, thereby providing even more miniature integrated optical device.

Those skilled in the art will readily appreciate that various modifications and changes can be applied to the preferred embodiments of the invention as hereinbefore exemplified without departing from its scope defined in and by the appended claims.

What is claimed is:

1. A multisegment laser diode structure comprising two spaced-apart linear waveguide segments and two spaced-apart ring-like waveguide segments carried on a substrate, each of the ring-like waveguide segments being optically coupled to each of the linear waveguide segments, wherein the two spaced-apart ring-like waveguide segments serve as resonator loop cavities which form together with the linear waveguide segments a closed loop compound resonator, wherein at least one of the waveguide segments includes an active lasing material, the segments'arrangement enabling separate electrical contact to each of the segments, thereby enabling separate operation of each of the segments by current injection or application of an external field.

2. The structure according to claim 1, and also comprising the separate electrical contacts to the segments, respectively, the contacts being formed by burying all the segments and creating four electrodes in electrical contact with the four segments, respectively, wherein the four electrodes are exposed on an outer surface of the diode structure.

3. The laser diodestructure according to claim 1, wherein each of the waveguide segments is made of an active lasing material.

4. The structure according to claim 3, being an index-guide type laser.

5. The structure according to claim 3, being a gain-guide type laser.

6. The structure according to claim 5, wherein each of the waveguide segments is surrounded by proton implanted regions.

7. The laser diode according to claim 1, wherein at least one of the segments serves as a light modulator.

8. The laser diode according to claim 1, wherein at least one of the segments serves as a q-switch.

9. A multisegment index-guide type laser structure comprising:
two spaced-apart linear waveguide segments and two spaced-apart ring-like waveguide segments carried on a substrate, each of the ring-like waveguide segments being optically coupled to each of the linear waveguide segments, wherein the two spaced-apart ring-like waveguide segments serve as resonator loop cavities which form together with the linear waveguide segments a closed loop compound resonator at least one of the waveguide segments including an active lasing material, all the waveguide segments being buried; and four electrodes in electrical contact with the four waveguide segments, thereby enabling separate driving of each of the waveguide segments by current injection or application on an external field, wherein the four electrodes are exposed on an outer surface of the diode structure.

10. A multisegment gain-guide type laser diode structure comprising:

two spaced-apart linear waveguide segments and two spaced-apart ring-like waveguide segments carried on a substrate, each of the ring-like waveguide segments being optically coupled to each of the linear waveguide segments, wherein the two spaced-apart ring-like waveguide segments serve as resonator loop cavities which form together with the linear waveguide segments a closed loop compound resonator, at least one of the waveguide segments including an active lasing material, each of the waveguide segments being surrounded by proton implanted regions; and four electrodes in electrical contact with the four waveguide segments, thereby enabling separate driving of each of the waveguide segments by current injection or application of an external field, wherein the four electrodes are exposed on an outer surface of the diode structure.

11. An integrated optical device comprising the laser diode structure constructed according to claim 1, and at least one additional waveguide segment optically coupled to at least one of the four waveguide segments of the laser diode structure.

12. The device according to claim 11, wherein said additional waveguide segment is associated with an additional optical structure for performing an additional function.

13. The device according to claim 12, wherein said additional optical structure is a flared amplifier.

14. The device according to claim 12, wherein said additional waveguide is a passive waveguide directing light to said additional optical structure.

15. The device according to claim 11, wherein the segments of the laser diode structure and said additional waveguide segment are located in a common plane.

16. The device according to claim 11, wherein the segments of the laser diode structure and said additional waveguide segment are located in different planes, the coupling between the additional waveguide segment and said at least one segment of the laser diode structure being carried out by at least one additional ring-like waveguide.

17. An integrated optical device comprising:

a multisegment laser diode structure composed of two spaced-apart linear waveguide segments and two spaced-apart ring-like waveguide segments carried on a substrate, each of the ring-like waveguide segments being optically coupled to each of the linear waveguide segments, wherein the two spaced-apart ring-like waveguide segments serve as resonator loop cavities which form together with the linear waveguide segments a closed loop compound resonator, at least one of the waveguide segments including an active lasing material; the segments' arrangement enabling separate electrical contacts to said waveguide segments, respectively; and at least one additional waveguide segment optically coupled to at least one of the four waveguide segments of the laser diode structure and associated with an additional optical structure for performing a certain additional function.

18. A method for manufacturing a multisegment laser diode structure to enable separate driving of each waveguide segment of the laser diode structure, the method comprising:

(a) growing a semiconductor structure with a p-n junction between two semiconductor layers and an active laser layer within the junction;

(b) patterning said semiconductor structure and carrying out layer deposition processes, to define the waveguide segment in the form of two spaced-apart linear metalized ridge segments and two spaced-apart ring-like metalized ridge segments, the segments arrangement providing desired optical coupling of each of the ring-like segments to each of the linear segments, each of the ridge segments being formed with a metal layer on top thereof;

(c) carrying out burying layer deposition onto a structure obtained in step (b), allowing for contact windows above each of the segments; and (d) carrying out a further metal deposition to form four electrodes exposed on an outer surface of the diode structure in contact with the metal layer on top of the four segments, respectively.

19. The method according to claim 18, wherein said patterning comprises dry etching of the top layer of said semiconductor structure.

20. The method according to claim 19, wherein step (L) also comprises a proton implantation process applied to selective regions of the top semiconductor layer, to define proton implanted regions within the spaces between each two locally adjacent ridges.

21. The method according to claim 18, wherein said patterning comprises the steps of:

performing dry etching of the top layer of said semiconductor structure to define said two spaced-apart linear metalized ridge segments;

etching either all the layers of said semiconductor structure or the top and the active laser layer within the space between said linear metalized ridge segments, thereby defining an interlaser spacing;

sequentially coating said interlaser spacing by a buffering layer, and a layer made of a material with a refraction index higher than that of the buffering layer; and defining said two spaced-apart ring-like metalized ridge segments in said layer of the higher refraction index material.

* * * * *